United States Patent [19]  
Brower

[11] 4,130,857  
[45] Dec. 19, 1978

[54] MULTILAMP PHOTOFLASH UNIT
[75] Inventor: Boyd G. Brower, Williamsport, Pa.
[73] Assignee: GTE Sylvania Incorporated, Stamford, Conn.
[21] Appl. No.: 785,987
[22] Filed: Apr. 8, 1977
[51] Int. Cl.² ............................................. G03B 15/02
[52] U.S. Cl. ....................................... 362/10; 362/15; 362/227
[58] Field of Search ..................... 240/1.3; 362/10, 15, 362/227

[56] References Cited  
U.S. PATENT DOCUMENTS 3,935,442  1/1976  Hanson .............................. 240/1.3

Primary Examiner—Stephen J. Lechert, Jr.  
Attorney, Agent, or Firm—Edward J. Coleman

[57] ABSTRACT

A photoflash lamp array comprising a plurality of high voltage type flashlamps mounted on a printed circuit board containing circuitry for sequentially igniting the flashlamps in response to successive high voltage firing pulses applied thereto. A plurality of reflectors respectively associated with the flashlamps are disposed between the lamps and circuit board, with each reflector having an aperture in alignment with a corresponding aperture in the circuit board. Connected in series with each but the last lamp of the array is a radiant-energy-activated disconnect switch comprising a strip of electrically conductive heat shrinkable, polymeric material which is attached at both ends to the circuit board so as to bridge a respective one of the apertures therein. The circuitry further includes a plurality of radiant-energy-activated connect switches disposed on the circuit board in alignment with respective reflector apertures and each comprising a mass of high resistance material convertible to a conductive state upon being activated by radiant-energy. The high resistance material is also disposed on and about each of the ends of the disconnect switch strips, whereby the high resistance material provides mechanical protection for the disconnect switch ends and electrical insulation between the circuitry connected to and located adjacent these switch ends and the conductive reflectors and/or proximate circuitry. In making the circuit board, first the disconnect switch strips are mounted on a nonconductive substrate; then conductive ink is printed on the substrate in a desired circuit pattern and cured; then a paste of the high resistance material is printed on the substrate in a desired pattern of patches to provide both the connect switches and the areas of protection and insulation.

11 Claims, 7 Drawing Figures

U.S. Patent
Dec. 19, 1978
4,130,857
FIG. 1  FIG. 2  FIG. 3
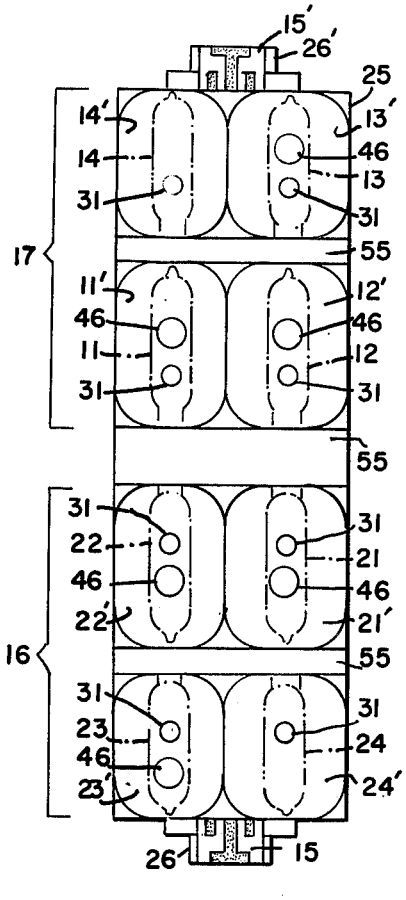
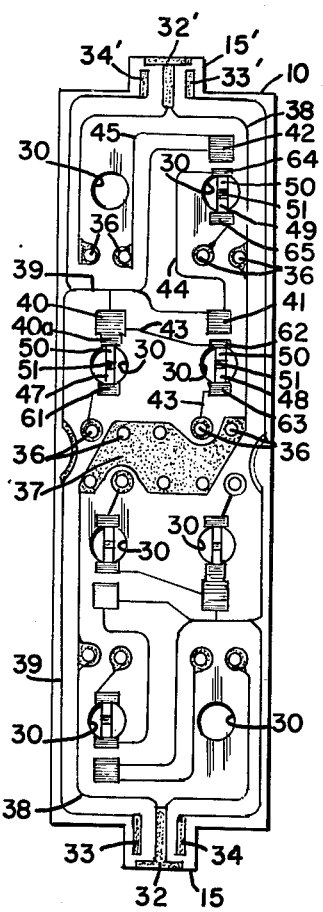
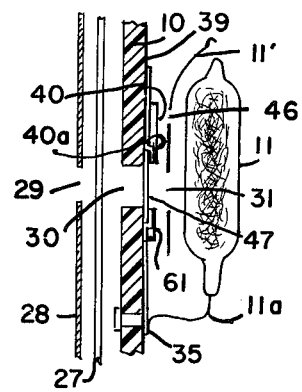
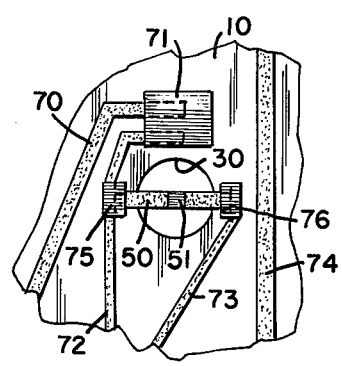
FIG. 7
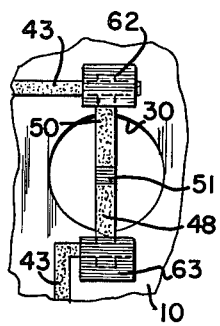
FIG. 4  FIG. 5  FIG. 6

MULTILAMP PHOTOFLASH UNIT

CROSS-REFERENCES TO RELATED APPLICATIONS

Ser. No. 614,108, filed Sept. 17, 1975, now U.S. Pat. No. 4,017,728 Emery G. Audesse et al; "Multilamp Photoflash Unit Having Radiant-Energy-Activated Quick-Disconnect Switch," assigned to the same assignee as this invention.

Ser. No. 733,599, filed Oct. 18, 1976, John W. Shaffer, "Radiation Switch For Photoflash Lamp," assigned to the same assignee as this invention.

BACKGROUND OF THE INVENTION

This invention relates to multilamp photoflash devices having circuit means for sequentially igniting the flashlamps and, more particularly, to an improved method for making a printed circuit board for a multilamp photoflash unit.

Numerous multilamp photoflash arrangements with various types of sequencing circuits have been described in the prior art, particularly, in the past few years. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of a proximate flashed lamp. The present invention is concerned with an improved method of making the sequencing circuitry for a relatively inexpensive photoflash unit of the disposable type. In particular, the present invention is particularly advantageous in photoflash arrays employing high voltage type lamps adapted to be ignited sequentially by successively applied high voltage firing pulses from a source such as a camera-shutter-actuated peizoelectric element.

A currently marketed photoflash unit of the last-mentioned type is described in U.S. Pat. No. 3,894,226 and referred to as a flip flash. The unit comprises a planar array of eight high voltage type flashlamps mounted on a printed circuit board with an array of respectively associated reflectors disposed therebetween. The lamps are arranged in two groups of four disposed on the upper and lower halves, respectively, of the rectangular shaped circuit board. A set of terminal contacts at the lower end of the unit is provided for activation of the upper group of lamps, while a set of terminal contacts at the top of the unit is operatively associated with the lower group of four lamps. The application of successive high voltage pulses (e.g., 500 to 4000 volts from, say, a piezoelectric source controlled by the shutter of a camera in which the array is inserted) to the terminal contacts at the lower end of the unit causes the four lamps at the upper half of the array to be sequentially-ignited. The array may then be turned end for end and again inserted into the camera in order to flash the remaining four lamps.

The flip flash circuit board comprises an insulating sheet of plastic having a pattern of conductive circuit traces, including the terminal contacts, on one side. The flashlamp leads are electrically connected to these circuit traces by means of eyelets secured to the circuit board and crimped to the lead wires. The circuitry on the board includes six printed, normally open, connect switches, that chemically change from a high to low resistance, so as to become electrically conducting, after exposure to the radiant heat energy from an ignited flashlamp operatively associated therewith. A thermal connect switch of this general type is described in U.S. Pat. No. 3,458,270 of Ganser et al. The purpose of these switches is to promote lamp sequencing and one-at-a-time flashing. The four lamps of each group are arranged in parallel, with three of the four lamps being connected in series with a respective thermal connect switch. Initially, only the first of the group of four lamps is connected directly to the voltage pulse source. When this first lamp flashes, it causes its associated thermal connect switch (which is series connected with the next, or second, lamp) to become permanently conductive. Because of this action, the second lamp of the group of four is connected to the pulse source. This sequence of events is repeated until all four lamps have been flashed. A major problem of this prior art circuit and other similar arrangements is that if one lamp short-circuits internally upon flashing, the successive parallel lamps of that group of four cannot be flashed; i.e., the remaining lamps are shorted out.

It has been found that this problem can be eliminated by the use of a radiant-energy-activated switch that is normally conducting and which becomes nonconducting subsequent to exposure to the actinic output of the flashlamp associated therewith. This disconnect switch is used in series with each of the lamps, except the last lamp, in a sequentially flashing parallel group of high voltage flashlamps. It may be used, if desired, in addition to the printed connect switches, which are normally open and which close upon actinic exposure. Hence, the modes of action of these two types of switches are opposite from one another — the disconnect switch interrupts the igniting circuit of the lamp in series with it upon firing of that lamp, while the thermal connect switch establishes the igniting circuit for the next lamp upon being activated.

A number of radiant-energy-activated disconnect switches have been described in the prior art. Examples are U.S. Pat. Nos. 3,532,931 Coté et al., 3,726,631 De Graaf et al., 3,728,067 De Graaf et al., 3,692,995 Wagner, 3,666,394 Bok. A particularly fast acting disconnect switch is described in the aforementioned U.S. Pat. No. 4,017,728 of Audesse et al., wherein the switch element comprises a piece of electrically conductive, heat shrinkable, polymeric material which is positioned so as to be in operative relationship with the radiant output from the series connected lamp during the ignition thereof. Each switch element is attached at both ends to the lamp igniting circuit with the midportion of the element being spatially suspended to avoid contact with heat absorbing surfaces. Upon ignition of its associated lamp, the midportion of the switch element rapidly shrinks and separates in response to the radiant output of the lamp, thereby providing a quick-acting, reliable open circuit to high voltages.

According to one embodiment, these disconnect switches were employed in a photoflash array including a plurality of flashlamps mounted on a printed circuit board with a conductive reflector unit disposed between the lamps and circuitry. The circuit board is provided with a plurality of apertures respectively in alignment, via corresponding reflector apertures, with the flashlamps mounted thereon, and each length of conductive heat shrinkable material comprising a switch is attached to the circuit board so as to bridge a respective aperture therein. In this manner, the midportion of the material is spatially suspended to avoid contact with the circuit board. For silk screened circuitry it is advantageous to carry the conductive circuit pattern over the ends of the preapplied switch material, whereby the circuit material helps to anchor the switch ends to the circuit board substrate. During the production process, however, it has been observed that the circuit material covering the switch ends can be rubbed off or flaked off, causing a potential open circuit. Further, it was observed that the disconnect switch ends provided potential locations of shorting or arc-over to an adjacent reflector edge or nearby circuit traces.

SUMMARY OF THE INVENTION

Accordingly, it is an object of the present invention to provide a multilamp photoflash unit having improved circuit construction.

A principal object of the invention is to provide an improved construction for a printed board containing radiant-energy-activated disconnect switch strips in combination with photoflash lamps and associated reflectors.

Another object is to provide an improved method of making such a circuit board.

These and other objects, advantages and features are attained in accordance with the invention, by employing the high resistance material of the connect switches for the additional purpose of providing mechanical protection for the disconnect switch strip ends and electrical insulation between the circuitry connected to and located adjacent the disconnect switch strip ends and the conductive reflectors and/or proximate circuitry. This is provided by disposing patches of the high resistance material on and about each of the ends of the conductive strips comprising the disconnect switches.

The preferred method of making the circuit board comprises mounting the disconnect switch strips on a nonconductive substrate; printing conductive ink on the substrate in a desired pattern of circuit traces; curing the ink; printing a paste of the high resistance material onto the ink printed substrate in a desired pattern of patches with a first portion of the patch pattern being disposed to cover the attached ends of the disconnect switch strips and portions of circuit traces carried thereover and a second portion of the patch pattern being disposed to bridge selected portions of the circuit traces and thus provide connect switches; and curing the printed paste of high resistance material.

BRIEF DESCRIPTION OF THE DRAWINGS

This invention will be more fully described hereinafter in conjunction with the accompanying drawings, in which:

FIG. 1 is a front elevation of a multilamp photoflash unit with the array of lamps thereof shown in phantom;

FIG. 2 is a front elevation of a printed circuit board used in the array of FIG. 1, the circuit board including radiation disconnect switches having protective insulating patches in accordance with the invention;

FIG. 3 is a sectional schematic showing the alignment of an individual lamp of the array of FIG. 1 with respect to its reflector, circuit board switches, and flash indicator;

FIGS. 4, 5 and 6 are enlarged fragmentary detail views of portions of the circuit board of FIG. 2; and FIG. 7 is an enlarged fragmentary detail view of an alternative switch arrangement.

DESCRIPTION OF PREFERRED EMBODIMENT

FIGS. 1 and 2 illustrate portions of a multilamp photoflash unit similar to that described in the aforementioned U.S. Pat. No. 3,894,226. The unit includes a planar array of eight high voltage type flashlamps 11-14 and 21-24 mounted on a printed circuit board 10, with an array of respectively associated reflectors 11'-14' and 21'-24' disposed therebetween. The array is provided with a plug-in connnector tab 15 at the lower end thereof which is adapted to fit into a camera or flash adapter. A second plug-in connector tab 15' is provided at the top end of the unit, whereby the array is adapted to be attached to the camera socket in either of two orientations, i.e., with either the tab 15 or the tab 15' plugged into the socket. The lamps are arranged in two groups of four disposed on the upper and lower halves respectively of the rectangular shaped array. Upper group 17 comprises lamps 11-14, and lower group 16 includes lamps 21-24; the reflectors 11', etc. are disposed behind the respective lamps so that as each lamp is flashed, light is projected forwardly of the array. The lamps are arranged and connected so that when the array is connected to a camera by the connector tab 15 only the upper group 17 of lamps will be flashed, and when the array is turned end for end and connected to the camera by the other connector tab 15', only the then upper group 16 of lamps will be flashed.

The above-mentioned components are packaged in a rectangular boxlike plastic container 25, which may comprise two pieces of plastic that are secured together. The entire container may be molded from a generally clear plastic material, or at least the window portions in the front of the flash lamps are rendered light transmitting. The window portions may also be tinted for color correction purposes. The plastic container 25 includes integral extensions 26 and 26' at the ends thereof which partly surround and protect the connector tabs 15 and 15' and also function to facilitate mechanical attachment to the camera socket. Sandwiched between the front and back walls of the container 25, in the order named and as generally illustrated by the schematic drawing of FIG. 3, are the flash lamps 11, etc., a reflector member (preferably of aluminum-coated plastic) shaped to provide the individual reflectors 11' etc., the printed circuit board 10 provided with the integral connector tabs 15 and 15', and a flash indicator assembly comprising a sheet of heat shrinkable material 27 and an indicia sheet 28, which may be provided with instructions, information, trademarks, and other indicia such as flash indicators 29 located behind the respective lamps and which change color due to heat radiation from a flashing lamp, thus indicating at a glance which of the lamps have been flashed and not flashed. If the back surfaces of the reflectors are electrically conductive, an electrically insulating sheet (not shown) may be inserted between the reflectors and conductive traces on the circuit board, as described in the aforementioned U.S. Pat. No. 3,894,226.

The indicia sheet 28 may be of paper or thin cardboard and provided with openings where the flash indicators 29 are desired. The flash indicator material 27 may comprise a sheet of heat-sensitive plastic material, for example, biaxially oriented polyproplylene, which shrinks or melts when subjected to heat or radiant energy from an adjacent flashing lamp, thus effectively changing the color of the openings in the indicia sheet 28. For example, the plastic material can be colored blue on its backside by ink or other suitable means, and the blue disappears and the opening becomes a different color (dark, for example) when the plastic shrinks or melts away due to heat from an adjacent flashing lamp. The front of the plastic (toward the lamps) should be coated with dark ink so as to absorb heat more readily. A single flash indicator sheet 27 may be arranged over all of the flash indicator openings. Openings, or apertures, 31 are provided through each reflector unit, and correspondingly aligned openings or apertures 30 are provided in the circuit board 10, to facilitate radiation from the flashlamps reaching the flash indicators 29. The rear panel of the container 25 is transparent (either of clear material or provided with window openings) to permit viewing of the indicia sheet 28.

The tab 15 which is integral with the circuit board 10 is provided with a pair of electrical terminals 32 and 33, and similarly the tab 15' is provided with a pair of terminals 32' and 33', for contacting terminals of a camera socket for applying firing voltage pulses to the array. Each tab is provided with a third terminal 34 and 34' respectively, which functions to electrically short the circuitry of the inactive lower group of lamps, when the array is plugged into a socket. The terminals 32 and 32' are shown as having a lateral T-shaped configuration for temporarily shorting the socket terminals while the array is being plugged in to discharge any residual voltage which may remain in the firing pulse source and also to reduce the likelihood of lamps being accidentally flashed by electrostatic voltage when the array is handled.

The circuit board 10 has a "printed circuit" thereon, as will be described, for causing sequential flashing of the lamps by firing voltage pulses applied to terminals 32, 33 or 32', 33'. The top and bottom halves of the printed circuitry preferably are reverse mirror images of each other. The lead wire 11a, 11b, etc., of the lamps 11, etc., (only lead wires 11a is shown in FIG. 3) may be attached to the circuit board 10 in various ways, such as by means of metal eyelets 35 (FIG. 3) placed through openings 36 (FIG. 2) in the board. The lead wires pass through openings (not shown) in the reflector member and into or through the respective pairs of eyelets, and the ends of the eyelets are crimped or bent to hold the lead wires and make electrical contact thereto and also to hold the eyelets in place with their heads in electrical contact with the circuit of the circuit board. A metal clip (not shown) is clapped onto the reflector member, which reflector is preferably made of metal-coated plastic, and the rear of the clip rests in electrical contact with an area 37 (FIG. 2) of an electrical ground circuit run 38 on the board which includes the terminals 32 and 32' and which makes contact with one of the connector eyelets for each of the lamps, whereby the reflector unit additionally functions as an electrically grounded shield.

Areas 55 on the transparent front wall of the container 25 may be made opaque or partly opaque, such as by making the surface roughened at these areas, to fully or partly conceal the lamp lead-in wires and/or the lower portions of the lamps, for improved appearance of the array.

In the case of the prior art circuit board described in the aforementioned U.S. Pat. No. 3,894,226, terminal 33 is part of a conductor run 39 that is electrically connected by means of an eyelet 35 to one of the lead-in wires of lamp 11 and terminates at the solid state, radiation connect switches 40, 41 and 42 respectively positioned near lamps 11, 12 and 13. A circuit board conductor run 43 is connected electrically to a lead wire of flash lamp 12 via an associated eyelet and terminates at the connect switch 40. A circuit board conductor run 44 is connected to a lead wires of flash lamp 13 via an eyelet and terminates at the connect switch 41. Similarly, a circuit board connector run 45 is connected to a lead wire of flash lamp 14 via an eyelet and terminates at connect switch 42. The radiant-energy-activated connect switches 40, 41, and 42 are in contact with and bridge across the circuit runs that are connected to them. FIGS. 4 and 5 illustrate this for switches 40 and 41 respectively. The material for the connect switches is selected to be of a type initially having an open circuit or high resistance, the resistance thereof becoming nearly zero or a lower value when the material receives radiation in the form of heat and/or light from a respective adjacent lamp, upon the lamp being flashed. For this purpose, each of the connect switches is respectively positioned behind and near to a flashlamp 11, 12, and 13. To facilitate radiation transfer from a flashed lamp to its corresponding connect switch, each of the reflectors 11', 12' and 13' includes a second opening, or aperture, 46 in alignment respectively with the radiation connect switches 40, 41 and 42. Each of these connect switches has a composition useful to the invention, as will be described hereinafter, and upon receiving heat and/or light radiation from the adjacent lamp when it is flashed, changes from an open circuit or high resistance to a closed circuit or low resistance between its switch terminals on the circuit board. In lieu of the pair of openings 31 and 46, the aperture means of each reflector may comprise a long slot.

The lamp ignition circuitry further includes radiant-energy-activated disconnect switches 47, 48 and 49 each electrically connected in series with a respective one of the flashlamps 11, 12 and 13. More specifically, referring to FIG. 2, the normally closed disconnect switch 47 is series connected in the circuit run 39 to lamp 11; disconnect switch 48 is series connected in the conductor run 43 between lamp 12 and the normally open connect switch 40; and disconnect switch 49 is series connected in conductor run 44 between lamp 13 and connect switch 41. FIG. 4 more clearly illustrates the printed circuit pattern with respect to conductor run 39 and its physical relationship to switches 40 and 47. It will be noted that the run 39 actually passes straight through and beneath the patch of heat sensitive material employed in connect switch 40 in providing electrical path continuity to the element comprising disconnect switch 47. The connect switch 40 is then formed by the gap between the patch covered segment of conductor run 39 and the L-shaped terminus of conductor run 43. The physical arrangement of connect switch 41 is shown in FIG. 5.

As described in U.S. Pat. No. 4,017,728 Audesse et al., assigned to the present assignee, each of the quick-disconnect switches 47–49 comprises a length of electrically conductive, heat shrinkable, polymeric material which is attached to the circuit board at both ends, with its mid portion spatially suspended to avoid contact with the heat absorbing surfaces of the circuit board. This arrangement maximizes the speed with which the shrinking and separation of the midportion of the switch element occurs upon its being heated by the radiant output of an ignited flashlamp. More specifically, referring to the embodiment illustrated in FIG. 2, the disconnect switch comprises a thin strip 50 of plastic preferably fabricated from mono- or biaxially oriented polyethylene, polypropylene, polystyrene, polyester or nylon. The polymeric material itself may be rendered electrically conductive by additives such as carbons, or as illustrated, it may be rendered surface conductive by deposition of conductive layers thereon. Such conductive surface layers may be attained, e.g., by a vacuum metallization, electroless plating, printing, or coating using conductive inks, or by silk screening or by otherwise applying a conductive path across the switch defined by the polymeric film. The performance of highly reflective materials, such as aluminized polypropylene, can be enhanced by applying a coating or spot 51 of dark, light-absorbing ink or other similar material onto the surface facing the flashlamp. The piece of switch material may be self-adhesive, such as a tape, and pressure applied to attach both ends of the strip 50 to the circuit board as illustrated. Each attached strip is located so that it bridges a respective one of the circuit board apertures 30 so as to provide a desired spatial suspension of the midportion of the strip. For silk screened circuitry, it is advantageous to carry the circuit pattern over the ends of the preapplied switch strip. In this manner the circuit material helps to anchor the switch ends to the circuit board substrate, in addition to providing electrical connection of both ends of the switch strip into the printed circuit.

By locating the disconnect switch strips 50 across the apertures 30, each element of heat shrinkable material is positioned so as to be in operative relationship with the radiant output of its respective lamp via the reflector aperture 31. Hence, upon ignition of a given flashlamp, the switch material is radiantly heated so that it weakens and softens as well as shrinks. A separation occurs near the center of each piece, and the two severed ends shrink back away from each other so as to give an open circuit that will reliably withstand several thousand volts without leakage. Since a lamp after flashing is removed electrically from the circuit, the subsequent lamps are unaffected by short circuiting or residual conductivity in previously flashed lamps.

In accordance with the present invention, the high resistance material employed in providing the connect switches 40, 41 and 42 is also disposed on and about each of the ends of the disconnect switches. In the case of disconnect switch 47, this is accomplished by an extended portion 40a of the patch of high resistance material comprising connect switch 40, as best illustrated in FIG. 4. The other end of disconnect switch 47 is covered by a high resistance patch 61. The ends of disconnect switch 48 are covered by high resistance patches 62 and 63, as shown in FIG. 6, and the ends of disconnect switch 49 are covered by high resistance patches 64 and 65. In this manner, additional mechanical protection is provided for the ends of the disconnect switch strips. For example, in FIG. 4, the extended portion 40a of the high resistance material covers the adhesively attached end of strip 47 and the portion of conductive trace 39 carried over that strip end, thereby shielding the trace 39 carry-over from abrasion during the manufacturing process and further securing the strip to the circuit board. High resistance patches 62 and 64 provide similar functions with respect to the carry-over of traces 43 and 44, respectively. The insulating sheet 42 of U.S. Pat. No. 3,894,226 Hanson can be used to prevent spark-over or shorting between the conductive reflectors 11, 12 and 13 and these areas of circuitry. As further shown in the Hanson patent, however, this insulating sheet has large openings 53 through which the lamps and lead wires pass during assembly. Hence, the lower end of each of the strips 50 is susceptible to possible inadvertent shorting or spark-over to the reflector. Accordingly, patches 61, 63 and 65 at the lower ends of the disconnect switch strips provide a dual function. Firstly, the aforementioned mechanical protection of the conductive trace carry overs is provided, and secondly, the high resistance material of the patches prior to flashing provides insulation between the conductive ends of strips 50 and the nearby reflector surfaces to prevent shorting and spark-over. After flashing of a given lamp, if the associated patch 61, 63 or 65 becomes conductive, there is no problem as the radiation activated disconnection of the associated strip 50 removes that patch from the circuit. In summary, the high resistance patches provide insulation at least prior to firing of a respectively associated lamp. Although there are other methods of insulating the disconnect switch ends, such as by a coat of insulating resin, the use of the connect switch paste eliminates a production process, as will be made clear hereinafter, by combining a switch-depositing step and an insulating step.

As has been explained, the lower portion of the circuit board contains a substantially reverse mirror image of the same circuit shown in the upper part of the circuit board, and therefore will not be described in detail. It will be noted that the circuit runs from the plugged in terminals 32 and 33 at the lower part of the circuit board extend upwardly so as to activate the circuitry in the upper half of the circuit board. Similarly, when the unit is turned around and tab 15' is plugged into a socket, the circuit board terminals 32' and 33' will be connected to and activate the lamps which then will be in the upper half of the circuit board, and hence in the upper half of the flash unit. This accomplishes the desirable characteristic whereby only the group of lamps relatively farthest away from the lens axis will be flashed thereby reducing the possibility of the pheonomena known as "red eye."

The circuit on the circuit board 10 functions as follows. Assuming that none of the four lamps in the upper half of the unit have been flashed, upon occurrence of a first firing pulse applied across the terminals 32, 33, this pulse will be directly applied to the lead-in wires of the first connected flash lamp 11, whereupon the lamp 11 flashes and becomes an open circuit between its lead-in wires. Heat and/or light radiation from the flashing first lamp 11 is operative via its respective reflector and circuit board apertures to activate the disconnect switch 47 and the flash indicator aligned with aperture 31 of its reflector and the connect switch 40 aligned with the second aperture 46 of its reflector. As a result, the normally closed disconnect switch 47 is operative in response to the radiation from the lamp to rapidly provide a reliable open circuit to high voltages and thus electrically remove lamp 11 from the circuit, whereby the subsequent lamps 12, 13 and 14 are unaffected by short circuiting or residual conductivity in lamp 11. The radiation causes the normally open connect switch 40 to become a closed circuit (or a low value of resistance), thereby connecting the circuit board terminal 33 electrically to the lead-in wire of the second lamp 12 via the normally closed disconnect switch 48. By the time this occurs, the firing pulse has diminished to a value insufficient to cause the second lamp 12 to flash. Patches 40a and 61 may now be converted to conductive material but they have served their purpose as described hereinbefore. Patch 61 is removed from the circuit by open switch 47, and patch 40a can be insulated by sheet 42 of the Hanson patent. When the next firing pulse occurs it is applied to the lead-in wires of the second lamp 12 via the now closed connect switch 40 and disconnect switch 48, whereupon the second lamp 12 flashes, thereby causing disconnect switch 48 to rapidly provide an open circuit and causing connect switch 41 to assume near zero or low resistance. Patches 62 and 63 function in similar fashion to 40a and 61. When the next firing pulse occurs, it is applied via now closed connect switch 41 and disconnect switch 49 to the third lamp 13, thereby firing that lamp, whereupon the radiation from lamp 13 activates disconnect switch 49 to rapidly provide an open circuit and causes connect switch 42 to become essentially a closed circuit across its terminals. Patches 64 and 65 function in similar fashion to 40a and 61. Thus, the next firing pulse will be applied, via now closed connect switch 42, to the lead-in wires of the fourth flash lamp 14, thereupon causing the lamp to flash. Since this lamp is the last lamp in the active circuit, it does not matter whether its lead-in wires are an open or closed circuit after flashing. Additional flashlamps, radiant-energy-activated switches, and electrical conductors can be employed if desired, using the just applied principle. When the flash unit is turned around and the other connector tab 15' attached to the camera or socket, the group of lamps that then become uppermost and relatively farthest away from the lens axis will be an active circuit and will be flashed in the same manner as has been described. In a preferred embodiment, the lamps 11 etc., are high voltage types requiring between about 500 and 4000 volts, for example, at low current for flashing, and they can be fired by impacting or stressing a piezoelectric element in the camera.

In accordance with another aspect of the invention, a preferred method for making the printed circuit board for the described photoflash unit comprises the following steps. First, the conductive strips 50 of fusible material are mounted at the denoted selected locations on a nonconductive substrate, such as a thin sheet of polystyrene having the apertures illustrated in FIG. 2. Next, a conductive ink, such as silver flakes mixed in a binder, is screen printed onto the nonconductive substrate in the illustrated desired pattern of circuit traces with portions of the conductive circuit traces carried over the attached ends of the strips 50, as illustrated, for example, in FIGS. 4 and 6. The printed ink is then cured, for example, by air drying or passing the printed circuit boards through a low temperature drying oven. The ink printing of all circuit traces can be a single operational step. Next, a paste of high resistance material is screen printed onto the ink-printed, non-conductive substrate in a desired pattern of patches. A first portion of the patch pattern is disposed to cover the attached ends of strips 50 and the portions of circuit traces carried thereover; this portion of the patch pattern comprises areas 40a, 61, 62, 63, 64 and 65 (on each half of the board). A second portion of the patch pattern is disposed to bridge selected portions of the circuit traces to thereby provide connect switches 40, 41 and 42 (on each half of the board). The high resistance paste is then cured by air or oven drying. Hence, both the connect switches and protective insulating patches are screen printed onto the substrate in a single operational step.

An alternative method of making the circuit board comprises first printing the ink on the nonconductive substrate, curing the ink, and then mounting the strips 50 by attaching both ends to respective spaced apart portions of the circuit traces. For example, the strips 50 may have a conductive adhesive material on the side attached to the circuit traces. The high resistance paste pattern is then printed on the board in a single operational step as previously described.

The high resistance paste may comprise a known mixture of a silver compound and a binder. According to a preferred embodiment, however, the material comprises a silver compound such as silver carbonate, a binder such as polystyrene resin, and a protective oxidizing agent such as barium chromate, as described in the aforementioned application Ser. No. 733,599 of Shaffer. For example, the dried composition of a specific silk-screenable high resistance material which has been employed for such a patch pattern comprises 98.75% silver carbonate, 0.25% barium chromate, and 1.0% polystyrene resin as a binder. This mixture is made into a paste by ball milling in a suitable solvent such as butyl cellosolve acetate. The solids content may be adjusted to suit the method of switch application. For silk screening over a circuit board, I prefer to adjust the solids content to about 74%.

Silver oxide can be used instead of silver carbonate, and other useful binders include cellulose esters, cellulose ethers, polyalkylacrylates, polyalkylmethacrylates, styrene copolymers, vinyl polymers, and polycarbonate.

Alternative materials that would be expected to function satisfactorily as the protective oxidizing agent include the following: barium dichromate, cobaltous chromate, basic cupric chromate, lead chromate, basic lead chromate, silver chromate, silver dichromate, and zinc chromate. Other materials satisfying the stated requirements of reactivity as an oxidizer at normally encountered ambient conditions and sufficiently low solubility in water so as to not substantially affect the high humidity electrical conductivity of the basic silver carbonate composition could be used.

The application of the protective oxidizer as a thin layer over the silver compound would also be expected to be functional, as an alternative to direct incorporation.

The percentage of oxidizer in the final dried composition may be from 0.01 percent to about 20 percent by weight. At very low levels the protective effect diminishes, whereas at higher percentages the conductivity of the switch after activation suffers. I prefer to use from about 0.02 percent to 2.0 percent, and find that from 0.1 percent to 0.25 percent is sufficient.

Accordingly, although the invention has been described with respect to specific embodiments, it will be appreciated that modifications and changes may be made by those skilled in the art without departing from the true spirit and scope of the invention. For example, consider the alternative circuit arrangement of FIG. 7. In this instance, the disconnect switch strip 50 is attached to circuit board 10 so as to extend laterally across aperture 30 (rather than parallel with the lamp axis). Conductive trace 70 extends to provide one contact for a connect switch 71, while a traced 72 provides the other connect switch contact. In addition, trace 72 is carried over one end of strip 50. A trace 73 contacts the other end of strip 50. Trace 74 represents a proximate "ground" run of the circuit. In this instance, patches 75 and 76 of high resistance material covering each end of conductive strip 50 provide insulation to prevent shorting or spark-over between the strip ends and the nearby circuit traces 70 or 74. Further, in this position the patches 75 and 76 are masked by the reflector during flashing and thereby retain their insulating properties after lamp flashing. As previously described, patches 71, 75 and 76 are screen printed of the same material in a single operation.

What I claim is:

1. A multilamp photoflash unit comprising, in combination:

a printed circuit board having circuitry on a surface thereof;

a plurality of flashlamps positioned over said surface and having lead-in wires connected to said circuitry, said circuitry being provided for sequentially igniting said flashlamps;

a plurality of electrically conductive reflectors respectively associated with said flashlamps and positioned between said lamps and said circuit board, at least a subplurality of said reflectors each having aperture means therein;

a respective subplurality of radiant-energy-activated disconnect switches attached to said circuit board in alignment respectively with the aperture means in said reflectors, each of said disconnect switches being electrically connected to said circuitry in series with a respective one of said flashlamps for interrupting the igniting circuit for said flashlamp after said flashlamp is ignited, and each of said disconnect switches comprising an electrically conductive strip of fusible material attached at both ends to said circuit board with the midportion of said strip being positioned so as to be in operative relationship with the radiant output of a respective ignited flashlamp via the aperture means in a respective reflector; and a respective subplurality of radiant-energy-activated connect switches disposed on said circuit board in alignment respectively with the aperture means in said reflectors, each of said connect switches being electrically connected to said circuitry in series with a respective one of said flashlamps for establishing the igniting circuit for said flashlamp after ignition of the preceding flashlamp in the igniting sequence, and each of said connect switches comprising a mass of high resistance material convertible to a conductive state upon being activated by radiant energy;

wherein the improvement comprises said high resistance material being further disposed on and about each of said ends of the conductive strips of material comprising said disconnect switches, said high resistance material providing mechanical protection for said disconnect switch strip ends and electrical insulation between the circuitry connected to and located adjacent said disconnect switch strip ends and said conductive reflectors and/or proximate circuitry.

2. The unit of claim 1 wherein said circuit board has at least a respective subplurality of apertures in alignment respectively with the aperture means of said reflectors, and the midportion of each of said conductive strips of fusible material is spatially suspended by bridging a respective one of the apertures in said circuit board.

3. The unit of claim 1 wherein each of said disconnect switch strips comprises a heat shrinkable polymeric material, each of said strips is self-adhesive on the side thereof attached to said printed circuit board, the circuitry on said circuit board comprises a pattern of conductive traces thereon, portions of said conductive traces are carried over the attached ends of each of said electrically conducting strips comprising a disconnect switch, and said high resistance material is disposed on and about said carried over portions of conductive traces.

4. The unit of claim 3 wherein said polymeric material comprising each of said disconnect switch strips is rendered electrically conducting by a deposit of conductive material on at least a portion of the surface of each of said strips.

5. The unit of claim 1 wherein the circuitry on said printed circuit board comprises a pattern of conductive traces thereon, portions of said conductive traces are carried over the attached ends of said disconnect switch strips, and said high resistance material is disposed on and about said carried over portions of conductive traces.

6. The unit of claim 1 wherein each of said dispositions of high resistance material for said connect switches and on the ends of said disconnect switch strips is in the form of a screen printed patch on said printed circuit board.

7. The unit of claim 1 wherein said high resistance material comprises a silver compound and a binder.

8. The unit of claim 7 wherein said sliver compound is silver oxide or silver carbonate.

9. The unit of claim 8 wherein said high resistance material further includes an oxidizing agent.

10. The unit of claim 9 wherein said high resistance material comprises a mixture of said silver compound, binder and oxidizing agent.

11. The unit of claim 9 wherein said silver compound is silver carbonate, said binder is polystyrene resin and said oxidizing agent is barium chromate.

* * * * *